US007298180B2

(12) United States Patent
Hung

(10) Patent No.: US 7,298,180 B2
(45) Date of Patent: Nov. 20, 2007

(54) LATCH TYPE SENSE AMPLIFIER

(75) Inventor: Lee Cheng Hung, Hu-kou (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 20 days.

(21) Appl. No.: 11/281,180

(22) Filed: Nov. 17, 2005

(65) Prior Publication Data

US 2007/0109024 A1    May 17, 2007

(51) Int. Cl.
*H03F 3/45*      (2006.01)
*G11C 7/00*     (2006.01)

(52) U.S. Cl. ............................. 327/57; 327/52; 365/207
(58) Field of Classification Search ............ 327/51–57; 365/205, 207
See application file for complete search history.

(56) References Cited

U.S. PATENT DOCUMENTS 3,440,444 A * 4/1969 Rapp ............................. 327/51
5,883,846 A * 3/1999 Lee ............................. 365/207
6,002,626 A * 12/1999 Lattimore et al. ........... 365/208
6,317,374 B2 * 11/2001 Feurle ........................ 365/205
6,711,079 B2 * 3/2004 Kang ........................ 365/207
2002/0048207 A1 * 4/2002 Kang ........................ 365/207

* cited by examiner

*Primary Examiner*—Linh My Nguyen
*Assistant Examiner*—William Hernandez
(74) *Attorney, Agent, or Firm*—K & L Gates LLP

(57) ABSTRACT

A latch type sense amplifier includes a latch unit, an amplifying unit and a circuit module for charging or discharging the latch unit. The latch unit is configured by two sets of serially coupled PMOS and NMOS transistors, whose gates and drains are cross-coupled. The amplifying unit is coupled between the latch unit and a complementary power supply for controlling the latch unit in response to a bit line signal and a complementary bit line signal. The circuit module is designed to charge or discharge the data storage node and the complementary data storage node of the latch unit in response to the bit line signal and the complementary bit line signal, without using a current path across the NMOS transistors therein, such that the data storage node and the complementary data storage node are charged or discharged in a manner insensitive to a mismatch between the two NMOS transistors.

16 Claims, 4 Drawing Sheets

LATCH TYPE SENSE AMPLIFIER

BACKGROUND

The present invention relates generally to integrated circuit (IC) designs, and more particularly to a latch type sense amplifier that is insensitive to device mismatch issues.

Sense amplifier (SA) is a basic component that is used for both programming and reading operations for memory devices. During the operation, a typical sense amplifier is turned on in response to the signals on a bit line and its complement. The operation of sense amplifier can be divided into a pre-charge/discharge phase and an evaluation phase. For a conventional voltage-mode sense amplifier, the evaluation speed is proportional to the evaluation chain conductivity and is inversely proportional to its capacitance. The pre-charge speed of the conventional voltage-mode sense amplifier is proportional to the pre-charge transistor conductivity and is inversely proportional to its capacitance. The capacitance of the conventional voltage-mode sense amplifier is a function of the load capacitance, evaluation chain capacitance and pre-charge transistor capacitance.

A latch type sense amplifier typically includes a voltage-mode sense amplifier coupled to a latch. The sense amplifier charges the latch to store a value at its data storage node in response to the bit line signal. The stored value can be reversed when the bit line signal and its complement are switched.

The latch type sense amplifier may fail due to the mismatched devices within its latch. The latch typically is configured by two sets of serially coupled PMOS and NMOS transistors where the PMOS transistors are coupled to a power supply and the NMOS transistors are coupled to the sense amplifier. During the operation, the bit line signal and its complement activate the sense amplifier to selectively charge or discharge the storage nodes through the NMOS transistors. Due to reasons, such as fabrication process variation, the two NMOS transistors can have mismatched electric characteristics, such as different threshold voltages. This can significantly delay the time for the sense amplifier to access the storage nodes of the latch. Moreover, as the semiconductor devices continue to shrink in size, the NMOS transistors within the latch becomes increasingly susceptible to process variation, thereby resulting in a higher chance of mismatch.

Thus, it is desirable to have a latch type sense amplifier that is insensitive to the device mismatch issues.

SUMMARY

The present invention discloses a latch type sense amplifier. In one embodiment of the invention, the latch type sense amplifier includes a latch unit, an amplifying unit and a circuit module for charging or discharging the latch unit. The latch unit includes a first PMOS transistor and a second PMOS transistor coupled to a power supply in parallel, and a first NMOS transistor and a second NMOS transistor serially coupled to the first and second PMOS transistors, respectively. The drains of the first PMOS and NMOS transistors are coupled to gates of the second PMOS and NMOS transistors at a data storage node for storing a value. The drains of the second PMOS and NMOS transistors are coupled to gates of the first PMOS and NMOS transistors at a complementary data storage node for storing a complementary value. The amplifying unit is coupled between the latch unit and a complementary power supply for controlling the latch unit in response to a bit line signal and a complementary bit line signal. The circuit module is designed to charge or discharge the data storage node and the complementary data storage node in response to the bit line signal and the complementary bit line signal, without using a current path across the first or second NMOS transistor, such that the data storage node and the complementary data storage node are charged or discharged in a manner insensitive to a mismatch of electrical characteristics between the first and second NMOS transistors.

The construction and method of operation of the invention, however, together with additional objectives and advantages thereof will be best understood from the following description of specific embodiments when read in connection with the accompanying drawings.

DESCRIPTION

Figure 1:
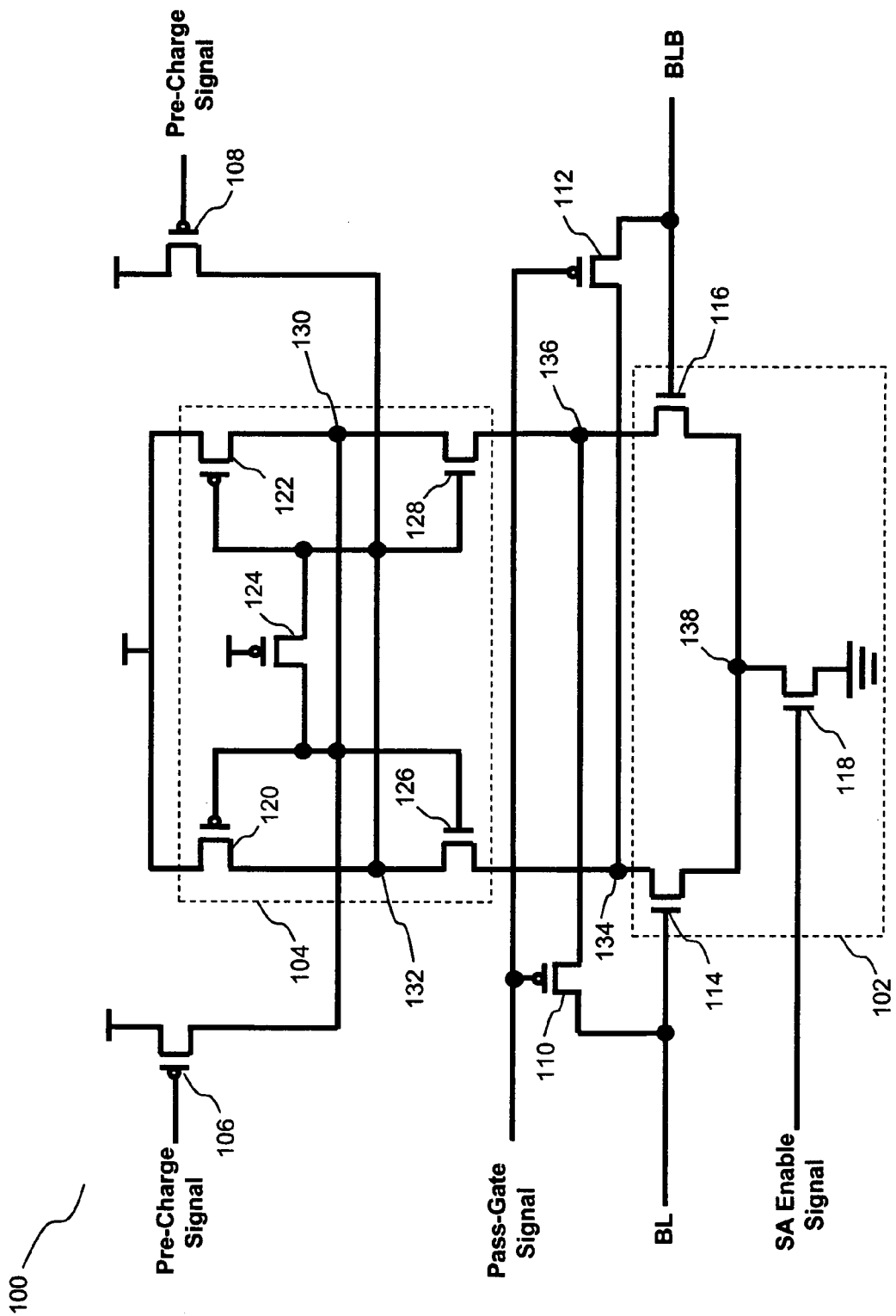
FIG. 1 illustrates a conventional latch type sense amplifier.

FIG. 1 illustrates a conventional latch type sense amplifier 100 that is sensitive to mismatch issues. The latch type sense amplifier 100 includes a basic sense amplifier 102, a latch 104, two pre-charge PMOS transistors 106 and 108, and two PMOS pass-gate transistors 110 and 112. The basic sense amplifier 102 includes three NMOS transistors 114, 116, and 118, while the conventional latch 104 includes three PMOS transistors 120, 122, and 124, as well as two NMOS transistors 126 and 128.

For the latch 104, the gates of the PMOS transistor 120 and the NMOS transistor 126 are tied together at a node 130 while the drains of both transistors 120 and 126 are also connected at a node 132. The gates of the PMOS transistor 122 and the NMOS transistor 128 are coupled together at the node 132 while the drains of the two transistors 122 and 128 are also connected at the node 130. The PMOS transistor 124 is implemented between the nodes 130 and 132 for biasing purposes. The sources of both PMOS transistors 120 and 122 are tied to a power supply while the sources of both NMOS transistors 126 and 128 are coupled to the basic sense amplifier 102 through nodes 134 and 136. The PMOS transistors 106 and 108 are implemented for pre-charge purposes for the amplifier 100 where the drain of the PMOS transistor 106 is coupled to the node 130 and the drain of the PMOS transistor 108 is coupled to the node 132. Both gates of the PMOS transistors 106 and 108 are coupled to their corresponding pre-charge signals that control the on and off states of the transistors to allow the power supply to pre-charge the amplifier 100.

For the basic sense amplifier 102, the NMOS transistor 118 is designed to control the operation state of the amplifier 100 in response to a sense amplifier enable signal provided at its gate. The gates of NMOS transistors 114 and 116 are tied to a bit lines signal BL and a complementary bit line signal BLB, respectively. Only one of the two NMOS transistors 114 and 116 is designed to be turned on at one time by a high signal provided from its corresponding bit line signal or complementary bit line signal. The sources of the NMOS transistors 114 and 116 are coupled together at a node 138, while the drain of the NMOS transistor 114 is coupled to the node 134, and the drain of the NMOS transistor 116 is coupled to the node 136. The PMOS pass-gate transistors 110 and 112, with their gates connected to a pass-gate control signal, are implemented for selection of the entire latch type sense amplifier 100. The PMOS pass-gate transistors 110 and 112 must be turned on in order for the amplifier 100 to operate.

During a write operation, the NMOS transistor 118 and the PMOS pass-gate transistors 110 and 112 are all turned on. In an exemplary scenario, when the bit line signal BL is high and the complementary bit line signal BLB is low, the NMOS transistor 114 will be turned on and the NMOS transistor 116 will be turned off. This results in the node 134 being pulled low while the node 136 is pulled high by the bit line signal BL. Assuming that the node 130 is at a low state and the node 132 is at a high state before the PMOS pass-gate transistors 110 and 112 are selected, the NMOS transistor 126 stays off and the NMOS transistor 128 stays on. After the PMOS pass-gate transistors 110 and 112 are selected, the node 130 is charged to high by the bit line signal BL. As a result, the NMOS transistor 126 will be turned on, the PMOS transistor 120 will be turned off, and the value at the node 132 will be flipped from high to low.

This conventional latch type sense amplifier 100 is susceptible to mismatch issues between the NMOS transistors 126 and 128. For example, the threshold voltages of the transistors may differ substantially, due to reasons such as fabrication process variation. Since the nodes 130 and 132 are charged or discharged through current paths across the NMOS transistors 126 and 128, the mismatch issue may cause the timings for changing the nodes 130 and 132 to be imbalanced. In a serious case, this may cause the amplifier 100 to fail. As semiconductor devices continue to shrink in size as the processing technology advances, the mismatch issue becomes a critical reliability and performance concern in IC designs.

Figure 2:
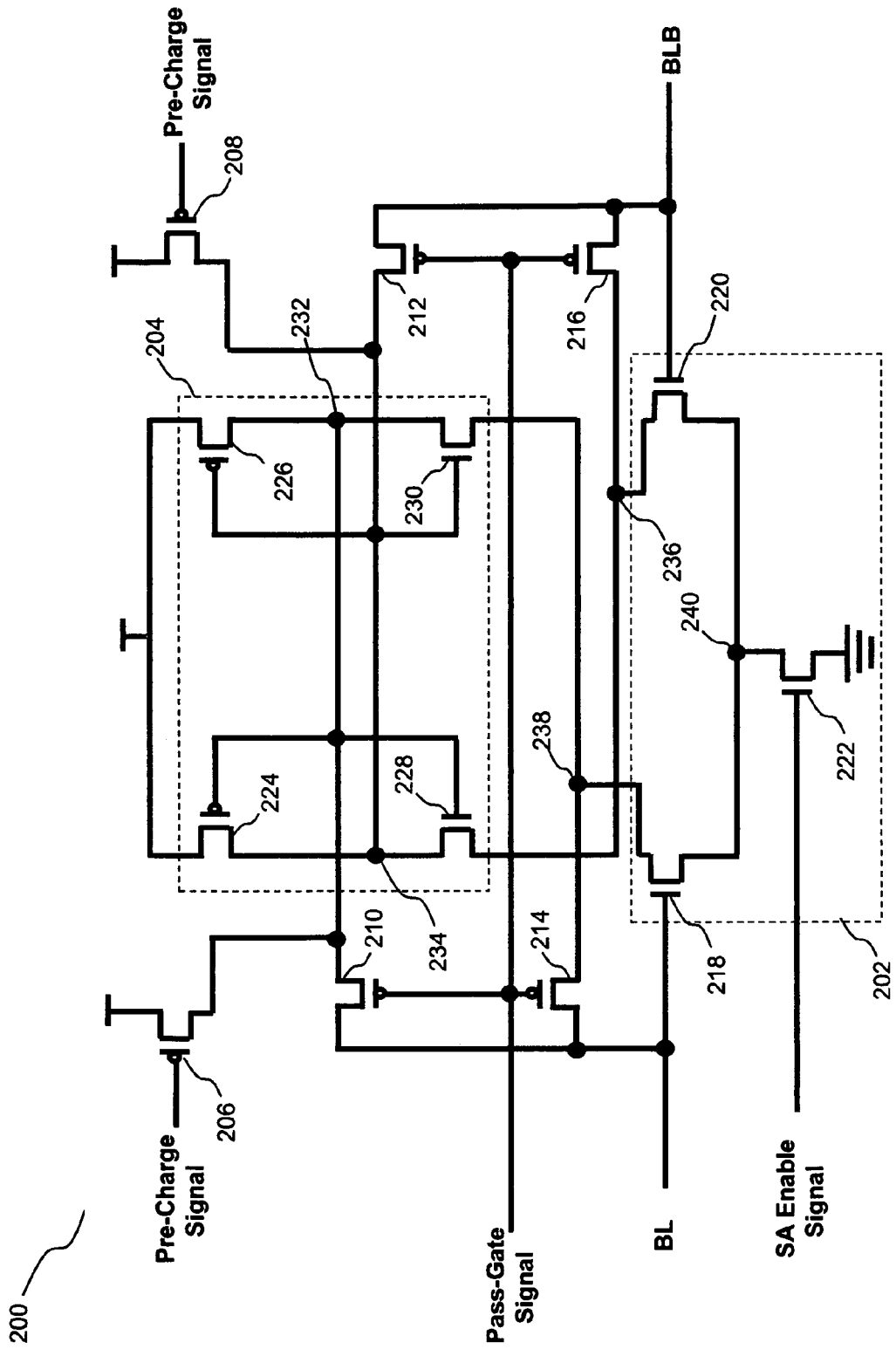
FIG. 2 illustrates a latch type sense amplifier in accordance with one embodiment of the present invention.

FIG. 2 illustrates an improved latch type sense amplifier 200 where additional transistors are implemented for improving its immunity to mismatch issues in accordance with one embodiment of the present invention. The improved latch type sense amplifier 200 includes a basic sense amplifier 202, a latch 204, two pre-charge PMOS transistors 206 and 208, and four pass-gate PMOS transistors 210, 212, 214 and 216. The basic sense amplifier 202 includes three NMOS transistors 218, 220, and 222, while the latch 204 includes two PMOS transistors 224 and 226, as well as two NMOS transistors 228 and 230.

For the latch 204, the gates of the PMOS transistor 224 and the NMOS transistor 228 are tied together at a data storage node 232, while the drains of both transistors 224 and 228 are also connected at a complementary data storage node 234. The gates of the PMOS transistor 226 and the NMOS transistor 230 are coupled together at the node 234 while the drains of the two transistors 226 and 230 are also connected at the node 232. The sources of both PMOS transistors 224 and 226 are tied to a power supply while the sources of both NMOS transistors 228 and 230 are coupled to the basic sense amplifier 202 through, respectively, a node 236 and a node 238. The PMOS transistors 206 and 208 are implemented for pre-charge purposes for the entire latch type sense amplifier 200 where the drain of the PMOS transistor 206 is coupled to the node 232 and the drain of the PMOS transistor 208 is coupled to the node 234. Both gates of the PMOS transistors 206 and 208 are supplied with a pre-charge signal that controls the on and off states of the transistors to allow the power supply to pre-charge the amplifier 200.

For the basic sense amplifier 202, the NMOS transistor 222 is designed to control the operation state of the latch type sense amplifier 200 depending on a sense amplifier enable signal provided at its gate. The gate of the NMOS transistor 218 is connected to a bit line signal BL, while the gate of the NMOS transistor 220 is connected to the complementary bit line signal BLB. The signals BL and BLB are complementary in their values so that only one of the two NMOS transistors 218 and 220 is designed to be turned on at one time. The sources of the NMOS transistors 218 and 220 are coupled together at a node 240, while the drain of the NMOS transistor 218 is coupled to the node 238 and the drain of the NMOS transistor 220 is coupled to the node 236. The PMOS pass-gate transistors 210, 212, 214 and 216, with their gates connected to a pass-gate control signal, are implemented for selection of the latch type sense amplifier 200. The sources of the PMOS pass-gate transistors 210 and 214 are coupled to the bit line signal BL while the sources of the PMOS pass-gate transistors 212 and 216 are coupled to the complementary bit line signal BLB. The drain of the PMOS transistor 210 is coupled to the node 232, while the drain of the PMOS transistor 212 is coupled to the node 234. The drain of the PMOS transistor 214 is also coupled to the node 238 and the drain of the PMOS transistor 216 is connected to the node 236.

During a write operation, the NMOS transistor 222 and the PMOS pass-gate transistors 210, 212, 214 and 216 are all turned on. In an exemplary scenario, when the bit line signal BL is high and the complementary bit line signal BLB is low, the node 232 is charged high and the node 234 is charged low, respectively, while the NMOS transistors 218 is turned on and the NMOS transistor 220 is turned off. The high charge at the node 232 turns on the NMOS transistor 228 and turns off the PMOS transistor 224. The low charge at the node 234 turns off the NMOS transistor 230 and turns on the PMOS transistor 226. Thus, the value at the node 232 remains high and the value at the node 234 remains low.

In this embodiment, the data storage node 232 and its complement 234 are directly charged or discharged by the bit line signal BL and its complement BLB through the PMOS transistors 210 and 212, without using the current paths across the NMOS transistors 228 and 230. Thus, the operation of the latch type sense amplifier 200 is insensitive to the mismatch, if any, between the NMOS transistors 228 and 230.

Note that the NMOS transistors 228, 230, 218, and 220 and the PMOS transistors 210, 212, 214, and 216 can be placed in a symmetry design to achieve a perfect matching sense amplifier for better performance. Also note that the pre-charge PMOS transistors 206 and 208 may also be removed as an alternative, and the bit line signal BL and its complement BLB can be used to perform the pre-charge operations.

Figure 3:
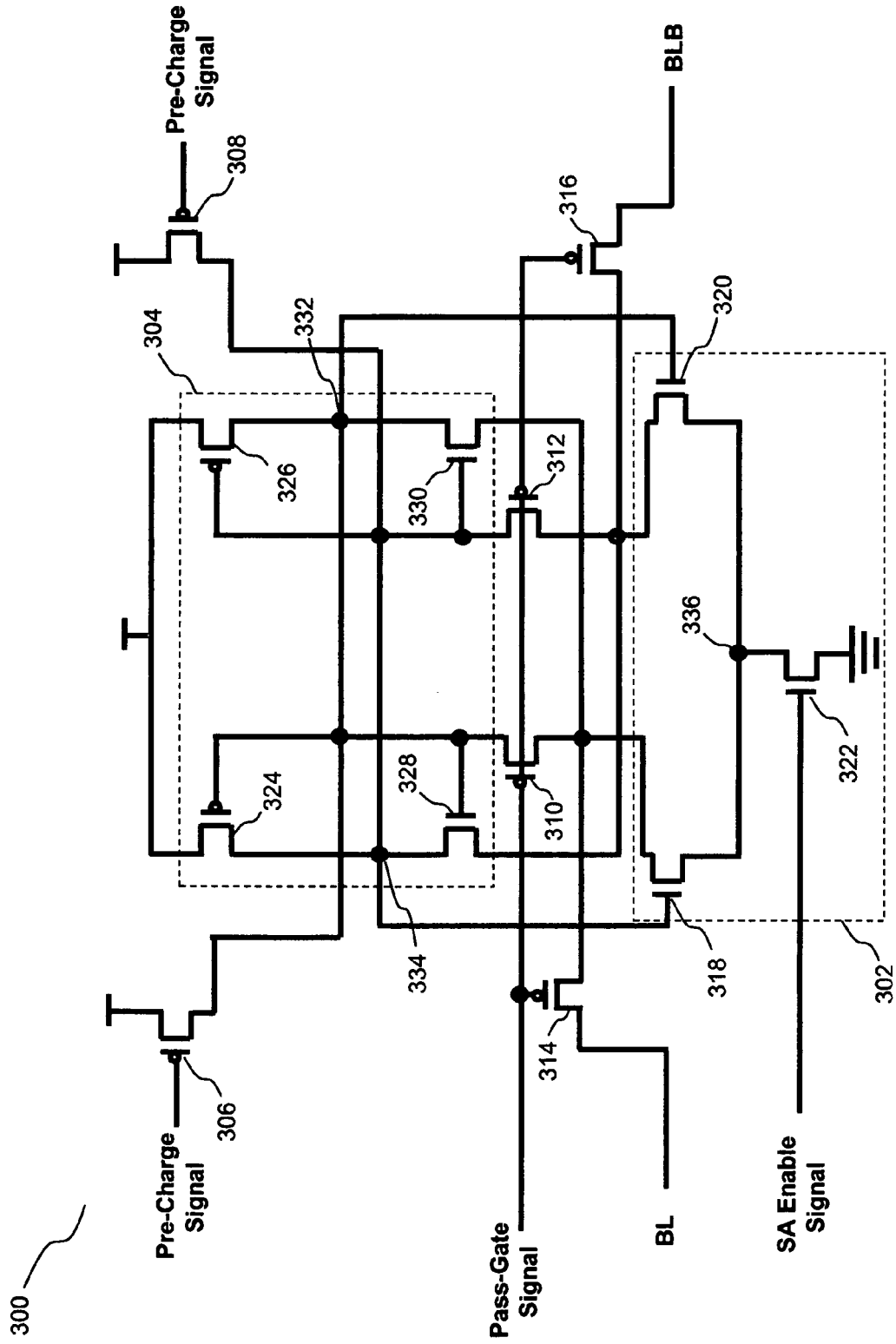
FIG. 3 illustrates a latch type sense amplifier in accordance with another embodiment of the present invention.

FIG. 3 illustrates another latch type sense amplifier 300 in accordance with another embodiment of the present invention. The latch type sense amplifier 300 includes a basic sense amplifier 302, a latch 304, two pre-charge PMOS transistors 306 and 308, and four pass-gate PMOS transistors 310, 312, 314 and 316. The basic sense amplifier 302 includes three NMOS transistors 318, 320, and 322, while the latch 304 includes two PMOS transistors 324 and 326 and two NMOS transistors 328 and 330.

For the latch 304, the gates of the PMOS transistor 324 and the NMOS transistor 328 are tied together at a data storage node 332, while the drains of both transistors 324 and 328 are also connected at a complementary data storage node 334. The gates of the PMOS transistor 326 and the NMOS transistor 330 are coupled together at the node 334 while the drains of the two transistors 326 and 330 are also connected at the node 332. The sources of the PMOS transistors 324 and 326 are tied to a power supply. The source of the NMOS transistor 328 is coupled to the drain of the PMOS pass-gate transistor 316 while the source of the NMOS transistor 330 is coupled to the drain of the PMOS pass-gate transistor 314. The PMOS transistors 306 and 308 are implemented for pre-charge purposes for the latch type sense amplifier 300 where the drain of the PMOS transistor 306 is coupled to the node 332 and the drain of the PMOS transistor 308 is coupled to the node 334. Both gates of the PMOS transistors 306 and 308 are supplied with a pre-charge signal that controls the on and off state of the transistors to allow the power supply to pre-charge the amplifier 300.

For the basic sense amplifier 302, the NMOS transistor 322 is designed to control the operation state of the entire latch type sense amplifier 300 depending on a sense amplifier enable signal, provided at the gate of the transistor, which determines whether or not the improved latch type sense amplifier 300 is operational. The gate of NMOS transistor 318 is tied to the node 334 and the gate of the NMOS transistor 320 is tied to the node 332. The signals BL and BLB are complementary in their values so that only one of the two NMOS transistors 318 and 320 is designed to be turned on at one time. The sources of the NMOS transistors 318 and 320 are coupled together at a node 336 while the drain of the NMOS transistor 318 is coupled to the drain of the PMOS pass-gate transistor 310 and the drain of the NMOS transistor 320 is coupled to the drain of the PMOS pass-gate transistor 312. The PMOS pass-gate transistors 310, 312, 314 and 316, with all of their gates connected to a pass-gate control signal, are implemented for selection of the latch type sense amplifier 300. The source of the PMOS pass-gate transistor 314 is coupled to the bit line signal BL while the source of the PMOS pass-gate transistor 316 is coupled to the complementary bit line signal BLB. The drain of the PMOS transistor 310 is coupled to the node 332 while the drain of the PMOS transistor 312 is coupled to the node 334. The source of the PMOS transistor 310 is coupled to the PMOS transistor 314, while the source of the PMOS transistor 312 is coupled to the PMOS transistor 316.

During a write operation, the NMOS transistor 322 and the PMOS pass-gate transistors 310, 312, 314 and 316 are all turned on. In an exemplary scenario, if the bit line signal BL is high and the complementary bit line signal BLB is low, a high signal will be at the source of the NMOS transistor 330 while a low signal will be at the source of the NMOS transistor 328. This signal difference at the drains of the NMOS transistor 328 and 330 forces the latch 304 to flip and latch the corresponding signal. The latched signal within the latch 304 can be read from the node 332 or 334 during a read operation.

Similar to the embodiment shown in FIG. 2, the data storage node 332 and its complement 334 can be charged and discharged directly through the path of the PMOS transistors 310 and 314 and the path of the PMOS transistors 312 and 316, respectively, without using a path across the NMOS transistor 328 or 330. Thus, the operation of the latch type sense amplifier 300 is insensitive to the mismatch, if any, between the NMOS transistors 328 and 330.

Note that the NMOS transistors 328, 330, 318, and 320 and the PMOS transistors 310, 312, 314, and 316 can be placed in a symmetry design to achieve a perfect matching sense amplifier. Also note that the pre-charge PMOS transistors 306 and 308 may also be removed as an alternative, and the bit line signal BL and its complement BLB can be used to perform the pre-charge operations.

Figure 4:
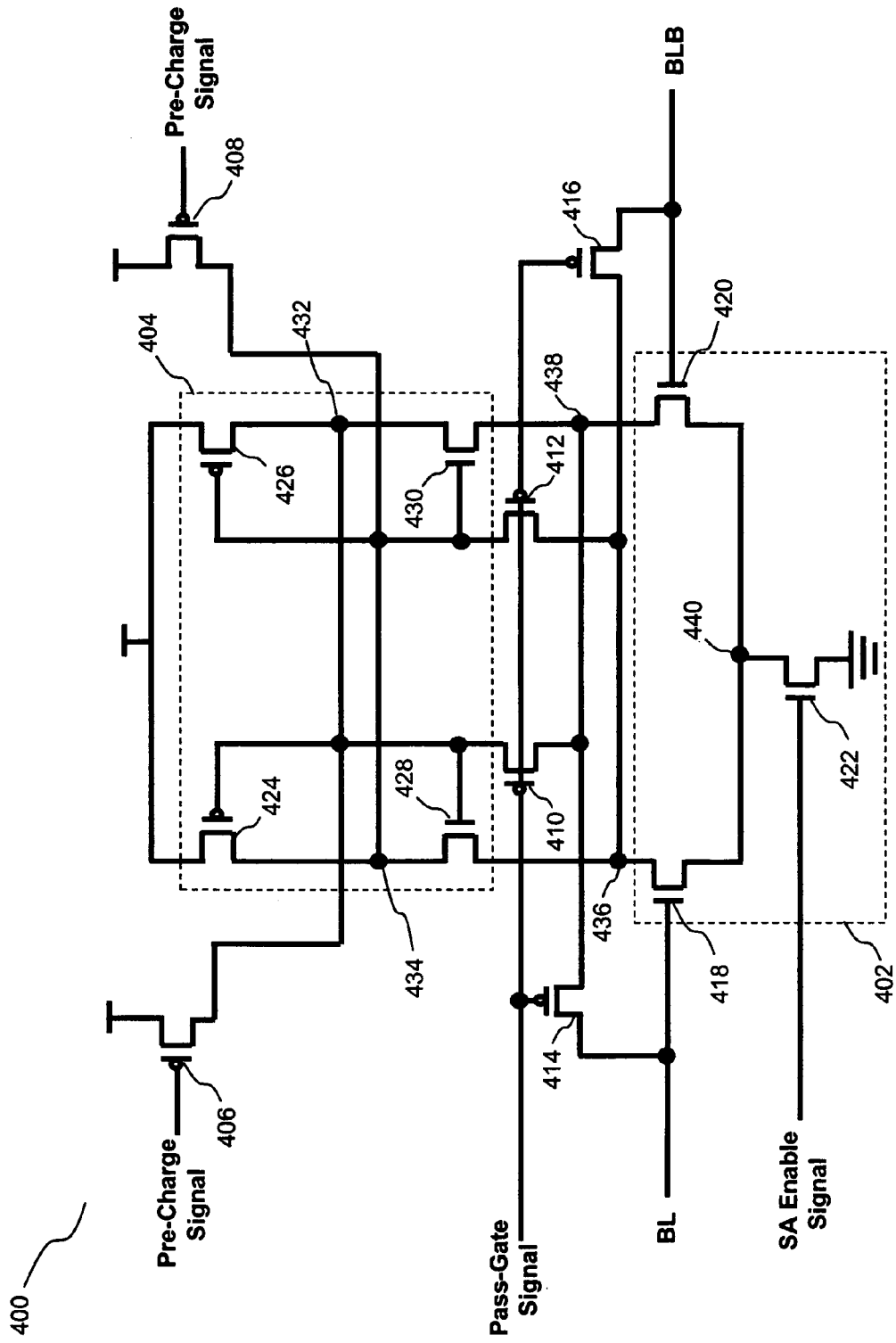
FIG. 4 illustrates a latch type sense amplifier in accordance with yet another embodiment of the present invention.

FIG. 4 illustrates a latch type sense amplifier 400 in accordance with another embodiment of the present invention. The latch type sense amplifier 400 includes a basic sense amplifier 402, a latch 404, two pre-charge PMOS transistors 406 and 408, and four pass-gate PMOS transistors 410, 412, 414 and 416. The basic sense amplifier 402 includes three NMOS transistors 418, 420, and 422, while the latch 404 includes two PMOS transistors 424 and 426 and two NMOS transistors 428 and 430.

For the latch 404, the gates of the PMOS transistor 424 and the NMOS transistor 428 are tied together at a data storage node 432 while the drains of both transistors 424 and 428 are also connected at a complementary data storage node 434. The gates of the PMOS transistor 426 and the NMOS transistor 430 are coupled together at the node 434 while the drains of the two transistors 426 and 430 are also connected at the node 432. The sources of both PMOS transistors 424 and 426 are tied to a power supply. The source of the NMOS transistor 428 is coupled to the drain of the NMOS transistor 418 within the basic sense amplifier 402 through a node 436, while the source of the NMOS transistor 430 is coupled to the drain of the NMOS transistor 420 within the basic sense amplifier 402 through a node 438. The PMOS transistors 406 and 408 are implemented for pre-charge purposes for the entire latch type sense amplifier 400 where the drain of the PMOS transistor 406 is coupled to the node 432 and the drain of the PMOS transistor 408 is coupled to the node 434. Both gates of the PMOS transistors 406 and 408 are supplied with a pre-charge signal that controls the on and off states of the transistors to allow the power supply that is connected to the drains of the PMOS transistors 406 and 408 to pre-charge the amplifier.

For the basic sense amplifier 402, the NMOS transistor 422 is designed to control the operation state of the entire latch type sense amplifier 400 according to a control signal provided at the gate of the transistor. The gate of NMOS transistors 418 is coupled directly to a bit-line BL and the gate of the NMOS transistor 320 is tied to another bit-line BLB. Due to complementary signals from the bit-lines BL and BLB, only one of the two NMOS transistors 418 and 420 is designed to be turned on at a time by a high signal. The sources of the NMOS transistors 418 and 420 are coupled together at a node 440 while the drain of the NMOS transistor 418 is coupled to the node 436 and the drain of the NMOS transistor 420 is coupled to the node 438. The PMOS pass-gate transistors 410, 412, 414 and 416, with all of their gates connected to a pass-gate control signal, are implemented for selection of the improved latch type sense amplifier 400 while providing a better mismatch immunity capability and improving the access time of the system by speeding up the data latching process during writing operation. The source of the PMOS pass-gate transistor 414 is coupled to the bit-line BL while the source of the PMOS pass-gate transistor 416 is coupled to the bit-line BLB. The source of the PMOS transistor 410 is coupled to the node 432 while the source of the PMOS transistor 412 is coupled to the node 434. The drain of the PMOS transistor 410 is also coupled to the node 438 while the drain of the PMOS transistor 412 is coupled to the node 436.

During a write operation, the NMOS transistor 422 and the PMOS pass-gate transistors 410, 412, 414 and 416 are all turned on. In an exemplary scenario, if the bit-line BL is charged high and the BLB is charged low, the NMOS transistor 418 will be turned on, thus pulling the node 436 to a low state. Meanwhile, the NMOS transistor 420 will be turned off, thus allowing the high signal from bit-line BL through the PMOS pass-gate transistor 414, which is turned on, to stay at the node 438. The high signal at the node 438 will turn on the NMOS transistor 428 while the low signal at the node 436 will turn off the NMOS transistor 430, thus allowing the latch 304 to flip and latch onto the corresponding signal. The latched signal within the latch 404 can be read from the node 432 or 434 during a read operation.

Similar to the embodiment shown in FIG. 2, the data storage node 432 and its complement 434 can be charged or discharged directly through the path of the PMOS transistors 410 and 414 and the path of the PMOS transistors 412 and 416, respectively, without using a path across the NMOS transistor 428 or 430. Thus, the operation of the latch type sense amplifier 300 is insensitive to the mismatch, if any, between the NMOS transistors 428 and 430.

Note that the NMOS transistors 428, 430, 418, and 420 and the PMOS transistors 410, 412, 414, and 416 may be placed in a symmetry design to achieve a perfect matching sense amplifier. Also note that the pre-charge PMOS transistors 406 and 408 can also be removed as an alternative, and the bit line signal BL and its complement BLB can be used to perform the pre-charge operations.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A latch type sense amplifier comprising:
a latch unit having a first PMOS transistor and a second PMOS transistor coupled to a power supply, and a first NMOS transistor and a second NMOS transistor serially coupled to the first and second PMOS transistors, respectively, drains of the first PMOS and NMOS transistors being coupled to gates of the second PMOS and NMOS transistors at a data storage node for storing a value, drains of the second PMOS and NMOS transistors being coupled to gates of the first PMOS and NMOS transistors at a complementary data storage node for storing a complementary value;
an amplifying unit coupled between the latch unit and a complementary power supply for controlling the latch unit in response to a bit line signal and a complementary bit line signal; and
a circuit module for charging or discharging the data storage node and the complementary data storage node in response to a pass-gate signal for passing the bit line signal and the complementary bit line signal to the data storage node and the complementary data storage node, without using a current path across the first or second NMOS transistor, such that the charging or discharging is not affected by a mismatch of electrical characteristics between the first and second NMOS transistors, and
wherein the circuit module comprises a third PMOS transistor coupled between the data storage node and the bit line signal and a fourth PMOS transistor coupled between the complementary data storage node and complementary bit line signal,
wherein the circuit module comprises a third PMOS transistor and a fourth PMOS transistor serially coupled between the data storage node and the bit line signal for passing the bit line signal to charge or discharge the data storage node without using the current path across the first NMOS transistor.

2. The latch type sense amplifier of claim 1 wherein a source of the first NMOS transistor is coupled to a connecting node between the third and fourth PMOS transistors.

3. The latch type sense amplifier of claim 2 wherein the circuit module comprises a fifth PMOS transistor and a sixth PMOS transistor serially coupled between the complementary data storage node and the complementary bit line signal for passing the complementary bit line signal to charge or discharge the complementary data storage node without using the current path across the second NMOS transistor.

4. The latch type sense amplifier of claim 3 wherein a source of the second NMOS transistor is coupled to a connecting node between the fifth and sixth PMOS transistors.

5. The latch type sense amplifier of claim 1 wherein the amplifying unit further comprises a third PMOS transistor for coupling the complementary data storage node to the complementary power supply through the amplifying unit, such that the complementary data storage node is pulled low without using a current path across the second NMOS transistor.

6. The latch type sense amplifier of claim 5 wherein the amplifying unit further comprises a fourth PMOS transistor for coupling the data storage node to the complementary power supply through the amplifying unit, such that the data storage node is pulled low without using a current path across the first NMOS transistor.

7. The latch type sense amplifier of claim 1 further comprising a first pre-charge device coupled between the power supply and the data storage node for selectively charging the same in response to a first pre-charge signal.

8. The latch type sense amplifier of claim 7 further comprising a second pre-charge device coupled between the power supply and the complementary data storage node for selectively charging the same in response to a second pre-charge signal.

9. An integrated circuit device comprising:
a latch unit comprising:
a first PMOS transistor coupled to a power supply;
a second PMOS transistor coupled to the power supply;
a first NMOS transistor serially coupled to the first PMOS transistor;
a second NMOS transistor serially coupled to the second PMOS transistors,
wherein drains of the first PMOS and NMOS transistors are coupled to gates of the second PMOS and NMOS transistors at a data storage node for storing a value, and drains of the second PMOS and NMOS transistors are coupled to gates of the first PMOS and NMOS transistors at a complementary data storage node for storing a complementary value;

an amplifying unit comprising:
a third NMOS transistor having a drain coupled to the source of the first NMOS transistor, and a gate being controlled by a bit line signal;
a fourth NMOS transistor having a drain coupled to the source of the second NMOS transistor, and a gate being controlled by a complementary bit line signal;
a fifth NMOS transistor having a drain coupled to sources of the third and fourth NMOS transistors, and a source coupled to a complementary power supply;
a third PMOS transistor coupled between the data storage node and the bit line signal; and
a fourth PMOS transistor coupled between the complementary data storage node and complementary bit line signal, wherein the third and fourth PMOS transistors are turned on for selectively charging or discharging the data storage node and the complementary data storage node in response to a pass-gate signal for passing the bit line signal and the complementary bit line signal to the data storage node and the complementary data storage node, without using a current path across the first or second NMOS transistor;
a fifth PMOS transistor coupled between the bit line signal and the first NMOS transistor, and a sixth PMOS transistor coupled between the complementary bit line signal and the second NMOS transistor.

10. The integrated circuit device of claim 9 further comprising a pass gate signal for controlling gates of the third, fourth, fifth and sixth PMOS transistors.

11. The integrated circuit device of claim 10 further comprising a first pre-charge device coupled between the power supply and the data storage node for selectively charging the same in response to a first pre-charge signal, and a second pre-charge device coupled between the power supply and the complementary data storage node for selectively charging the same in response to a second pre-charge signal.

12. An integrated circuit device comprising:
a latch unit comprising:
a first PMOS transistor coupled to a power supply;
a second PMOS transistor coupled to the power supply;
a first NMOS transistor serially coupled to the first PMOS transistor;
a second NMOS transistor serially coupled to the second PMOS transistors,
wherein drains of the first PMOS and NMOS transistors are coupled to gates of the second PMOS and NMOS transistors at a data storage node for storing a value, and drains of the second PMOS and NMOS transistor are coupled to gates of the first PMOS and NMOS transistors at a complementary data storage node for storing a complementary value;
an amplifying unit comprising:
a third NMOS transistor having a drain coupled to the source of the second NMOS transistor, and a gate being controlled by a bit line signal;
a fourth NMOS transistor having a drain coupled to the source of the first NMOS transistor, and a gate being controlled by a complementary bit line signal;
a fifth NMOS transistor having a drain coupled to sources of the third and fourth NMOS transistors, and a source coupled to a complementary power supply;
a first PMOS transistor string coupled between the data storage node and the bit line signal; and
a second PMOS transistor string coupled between the complementary data storage node and complementary bit line signal,
wherein the first and second PMOS transistor strings are turned on for selectively charging or discharging the data storage node and the complementary data storage node in response to a pass-gate signal for passing the bit line signal and the complementary bit line signal to the data storage node and the complementary data storage node, without using a current path across the first or second NMOS transistor.

13. The integrated circuit device of claim 12 further comprising a pass gate signal for turning on or off the first and second PMOS transistor strings, simultaneously.

14. The integrated circuit device of claim 13 further comprising a first pre-charge device coupled between the power supply and the data storage node for selectively charging the same in response to a first pre-charge signal, and a second pre-charge device coupled between the power supply and the complementary data storage node for selectively charging the same in response to a second pre-charge signal.

15. An integrated circuit device comprising:
a latch unit comprising:
a first PMOS transistor coupled to a power supply;
a second PMOS transistor coupled to the power supply;
a first NMOS transistor serially coupled to the first PMOS transistor;
a second NMOS transistor serially coupled to the second PMOS transistors,
wherein drains of the first PMOS and NMOS transistors are coupled to gates of the second PMOS and NMOS transistors at a data storage node for storing a value, and drains of the second PMOS and NMOS transistors are coupled to gates of the first PMOS and NMOS transistors at a complementary data storage node for storing a complementary value;
an amplifying unit comprising:
a third NMOS transistor having a gate coupled to the complementary data storage node;
a fourth NMOS transistor having a gate coupled to the data storage node;
a fifth NMOS transistor having a drain coupled to sources of the third and fourth NMOS transistors, and a source coupled to a complementary power supply;
a third PMOS transistor coupled between the first NMOS transistor and a bit line signal;
a fourth PMOS transistor coupled between the data storage node and the third PMOS transistor;
a fifth PMOS transistor coupled between the second NMOS transistor and a complementary bit line signal; and
a sixth PMOS transistor coupled between the complementary data storage node and the fifth PMOS transistor,
wherein the third, fourth, fifth and sixth PMOS transistors are turned on simultaneously for charging and discharging the data storage node and the complementary data storage node in response to a pass-gate signal for passing the bit line signal and the complementary bit line signal to the data storage node and the complementary data storage node, without using a current path across the first or second NMOS transistor.

16. The integrated circuit device of claim 15 further comprising a first pre-charge device coupled between the power supply and the data storage node for selectively charging the same in response to a first pre-charge signal, and a second pre-charge device coupled between the power supply and the complementary data storage node for selectively charging the same in response to a second pre-charge signal.

* * * * *